United States Patent [19]

Amini et al.

[11] Patent Number: 5,030,590

[45] Date of Patent: Jul. 9, 1991

[54] PROCESS FOR ETCHING POLYSILICON LAYER IN FORMATION OF INTEGRATED CIRCUIT STRUCTURE

[75] Inventors: Zahra H. Amini; Ian S. Latchford, both of Cupertino, Calif.

[73] Assignee: Applied Materials, Inc., Santa Clara, Calif.

[21] Appl. No.: 364,331

[22] Filed: Jun. 9, 1989

[51] Int. Cl.$^5$ .......................................... H01L 21/465
[52] U.S. Cl. .................................... 437/233; 437/228; 148/DIG. 51
[58] Field of Search ................. 437/233, 225, 228, 33; 156/651, 650; 148/DIG. 51, DIG. 17

[56] References Cited

U.S. PATENT DOCUMENTS 4,488,351 12/1984 Momose .............................. 437/228

OTHER PUBLICATIONS

Ghandhi, S. K., VLSI Fabrication Principles, 1983, pp. 488–490.

Primary Examiner—Brian E. Hearn
Assistant Examiner—Chandra Chaudhari
Attorney, Agent, or Firm—John P. Taylor

[57] ABSTRACT

The invention comprises an improvement in the process wherein a polysilicon layer, which is formed over a step on an integrated circuit structure and masked with a photoresist, is anisotropically etched to remove the exposed portions of the polysilicon layer leaving residues of polysilicon adjacent to the step and residues of a polymerized silicon/oxide-containing material adjacent the sidewalls of the masked portions of the polysilicon layer. The improvement comprises treating the integrated circuit substrate with a dilute hydroxide solution to remove both the polysilicon residues and the residues of polymerized silicon/oxide-containing material.

18 Claims, 2 Drawing Sheets

PROCESS FOR ETCHING POLYSILICON LAYER IN FORMATION OF INTEGRATED CIRCUIT STRUCTURE

BACKGROUND OF THE INVENTION

1. Field of the Invention

This invention relates to an improved process for etching a polysilicon layer on an integrated circuit structure wherein the improvement comprises using an additional etching step to selectively remove residues not removed during the anisotropic etching of the polysilicon layer.

2. Description of the Related Art

During the construction of an integrated circuit structure, a polysilicon layer may be formed which covers a raised portion or step on the integrated circuit structure. Such a step might, for example, comprise an oxide portion such as an isolation oxide or an oxide-covered polysilicon line, e.g., a poly 1 layer. Subsequent masking and anisotropic etching of this polysilicon layer, for example, to form another polysilicon line, can result in undesirable residues being left behind on the integrated circuit structure after the anisotropic etching step.

FIG. 1 shows such a polysilicon layer formed on an integrated circuit substrate, while FIGS. 2 and 3 show the structure of FIG. 1 respectively after first and second stages of an anisotropic etch of the polysilicon layer. In FIG. 1, polysilicon layer 20 is formed over silicon substrate 2 on which was previously formed a gate oxide layer 4 and raised steps 10 comprising polysilicon lines 12 covered by a oxide portion 14. A photoresist mask has been applied and patterned leaving photoresist portion 32 over a portion of polysilicon layer 20 where a line is to be formed from polysilicon layer 20. It will also be noted that a native oxide layer 16, of usually less than about 30 Angstroms thickness, is present over polysilicon layer 20.

Conventionally, polysilicon layer 20 is anisotropically etched (to avoid undercutting of the polysilicon beneath mask 32) by, for example, an RIE etch, using $Cl_2$, HCl, and HBr gases to remove the exposed portions of polysilicon layer 20 down to the level of oxide portion 14 and gate oxide 4, as shown in FIG. 2, while observing the emission from the plasma with optical emission spectroscopy to monitor increases in the intensity of the $Cl_2$ line indicative that the $Cl_2$ is not being used to line indicati etch polysilicon. This first portion of the RIE etch process leaves polysilicon shoulders 22 and oxide portions 18, representing the inverted corners of oxide layer 16 over polysilicon layer 20 where polysilicon layer 20 begins to cross over each step 10, remaining on the sides of step 10 due to the greater thickness of polysilicon layer 20 at these points as shown in FIG. 2.

The structure is then subjected to a further RIE etch or overetch to remove the remaining portions of polysilicon layer 20 on the sides of step 10, as shown in FIG. 3, by changing the chemistry of the RIE etch to provide a higher concentration of $O_2$ or HBr gas and a lower concentration of $Cl_2$ gas, as well as a reduction in power density from, e.g., about 250–350 watts down to about 50–120 watts for a 4" wafer, to make the etch more selective in the etching of polysilicon, which will reduce or eliminate inadvertant etching of gate oxide layer 4.

However, as can be seen in FIG. 3, completion of the RIE etch leaves polysilicon spikes or residues 24 adjacent step 10 as well as polymeric silicon/oxide-containing materials comprising sidewalls 26 on the sides of polysilicon line 28 and photoresist 32. The formation of the polysilicon residues 24 shown in FIG. 3 is apparently due to the presence of portions 18 of native oxide layer 16 which remain on the surfaces of polysilicon layer 20 over the corners of step 10 after the initial RIE etch, as shown in FIG. 2.

Conventionally, in the prior art, such residues of polymeric silicon/oxide-containing materials forming sidewalls 26 were removed by dipping the integrated circuit structure in HF. However, the HF will also etch the gate oxide and, therefore, unless the wet etch conditions are very carefully controlled, the gate oxide will also be removed, exposing the underlying silicon substrate.

Furthermore, the polysilicon spikes which form on the integrated circuit structure adjacent the raised step cannot be removed in this manner so attempts were made in the past to prevent the occurence of such spikes by treating the structure with HF to remove oxide portions 16 prior to the RIE etch. However, such attempts have not always resulted in elimination of the subsequent formation of the polysilicon spikes on the structure.

It would, therefore, be desirable to provide an improved process for the selective etching of a polysilicon layer wherein residues left adjacent steps and masked portions of the polysilicon layer after an anisotropic etching step could be selectively removed with minimum damage to oxide portions in or on the integrated circuit structure such as gate oxide over the silicon substrate.

SUMMARY OF THE INVENTION

It is, therefore, an object of this invention to provide an improvement in the process of anisotropically etching a polysilicon layer, which is formed over a step and masked with a photoresist, leaving residues of polysilicon adjacent to the step and residues of a polymerized material containing both silicon and oxide ad]acent the sidewalls of the masked portions of polysilicon, the improvement comprising treating the integrated circuit substrate after the anisotropic etching step with a dilute hydroxide solution to remove both the polysilicon residues and the polymeric residues of silicon/oxide-containing material.

DETAILED DESCRIPTION OF THE INVENTION

The invention comprises an improvement in the process wherein a polysilicon layer, which is formed over a step on an integrated circuit structure and masked with a photoresist, is anisotropically etched to remove the exposed portions of the polysilicon layer leaving residues of polysilicon adjacent to the step and residues of a polymerized material containing both silicon and oxide adjacent the sidewalls of the masked portions of polysilicon. The improvement comprises treating the integrated circuit substrate with a dilute hydroxide solution to remove both the polysilicon residues and the residues of polymerized silicon/oxide-containing material.

Figure 1:
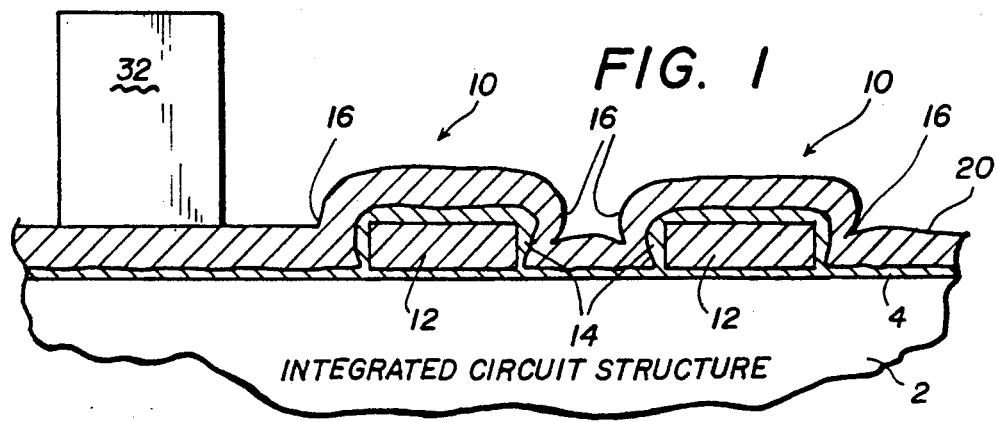
FIGS. 1–3 are fragmentary vertical side section views sequentially illustrating the prior art process of RIE etching a polysilicon layer which has been formed over a step and masked with a photoresist and showing the polysilicon spikes and polymeric silicon/oxide-containing residues left on the integrated circuit structure after such an RIE etching.
Figure 2:
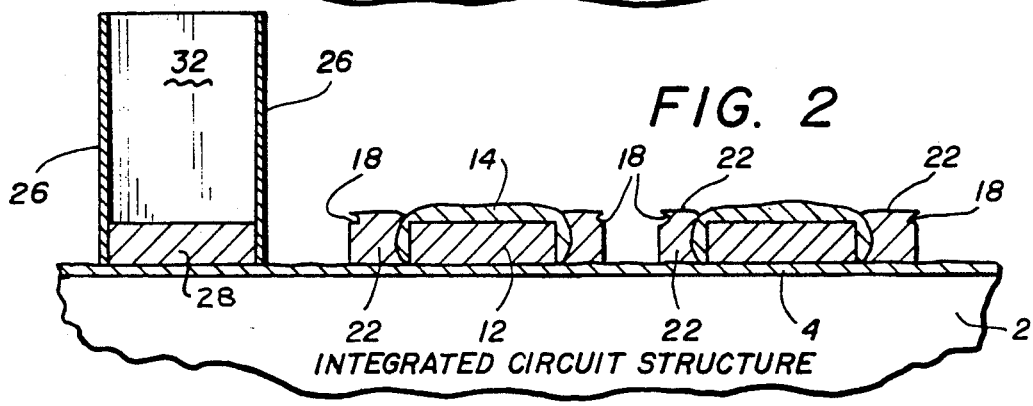
Figure 3:
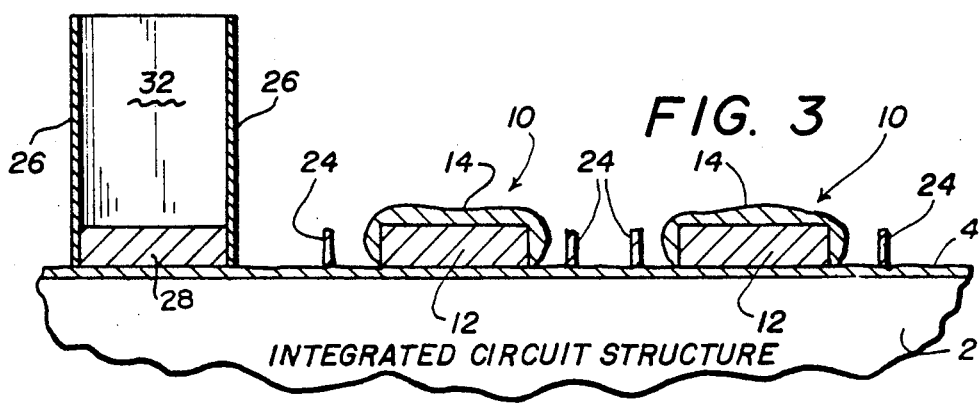

As discussed above, in the description of the prior art process for anisotropic RIE etching the polysilicon layer, spikes or residues 24 of polysilicon remain on integrated circuit structure or substrate 2 after completion of the RIE etch and sidewall portions 26 remain on the sides of the polysilicon line 28, as shown in FIG. 3. These sidewall portions 26 are not purely polysilicon, but rather appear comprise some sort of a polymerized material which includes both silicon and oxygen and which is, therefore, referred to herein as a "polymerized silicon/oxide-containing material".

In accordance with the invention, instead of attempting to remove the polymerized silicon/oxidecontaining material 26 by dipping the previously RIE etched structure in an HF bath or attempting to inhibit the formation of the polysilicon spikes or residues 24 by pretreating the structure with HF prior to the RIE etch to remove oxide portions 16, the RIE etched structure is treated with a dilute hydroxide solution after completion of the RIE etch.

This treatment with the dilute hydroxide solution will remove the undesired residues with minimum damage to the exposed oxide on substrate 2, e.g., gate oxide 4. By "minimum damage" is meant less than about 20 Angstroms, preferably less than about 10 Angstroms, of oxide is removed by the dilute hydroxide etch.

The dilute hydroxide solution is preferably an aqueous solution of either a potassium hydroxide or an ammonium hydroxide dissolved in water to provide a concentration of from about 0.5 to about 5.0 wt. %, preferably from about 0.5 to about 3.0 wt. %, hydroxide in the solution.

The dilute hydroxide solution is heated and then maintained, during the etch treatment, at a temperature of from about 40° to about 60° C., preferably from about 45° to 55° C., and most preferably is maintained at about 50° C.±2° C.

Figure 4:
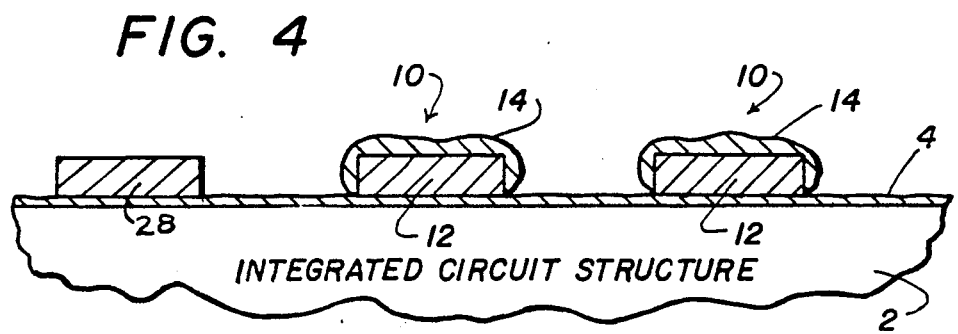
FIG. 4 is a fragmentary vertical side section view showing the integrated circuit structure of FIG. 3 after the isotropic hydroxide etching step of the invention to remove the polysilicon spikes and polymeric silicon/oxide-containing residues.
Figure 5:
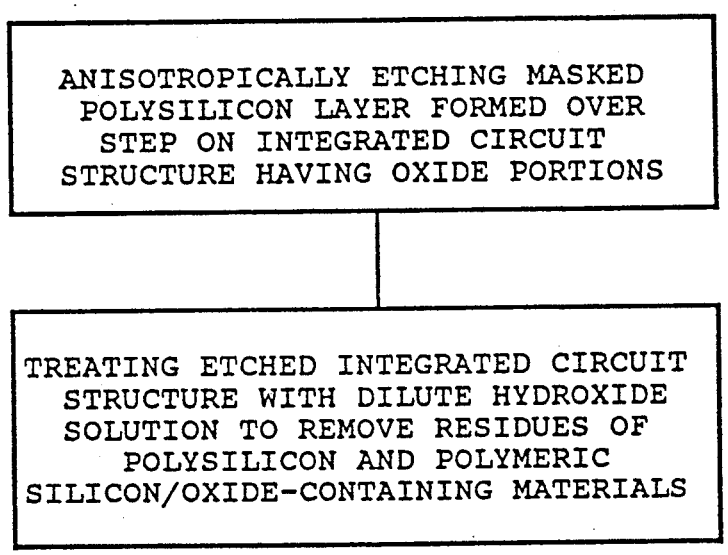
FIG. 5 is a flowsheet illustrating the improved process of the invention.

The RIE-etched integrated circuit structure is then immersed in the heated hydroxide solution for a period of no longer than about one minute, and usually for a time period ranging from about 5 to about 60 seconds, to remove both the polysilicon spikes or residues and the polymerized silicon/ oxide-containing materials on the structure, while maintaining the etched polysilicon profile, resulting in the structure shown in FIG. 4. It should be noted here that a majority of the photoresist mask will also be removed by this step, but a subsequent oxygen ash is also recommended to remove any remaining photoresist.

After removal of the integrated circuit structure from the hydroxide bath, the structure is rinsed in deionized water which is at room temperature, e.g. from about 20° to 25° C., or dried by flowing a heated gas such as nitrogen over the structure while maintaining the gas at a temperature not exceeding 100° C.

To further illustrate the process of the invention, an integrated circuit structure, comprising a silicon substrate having a gate oxide layer of about 200 Angstroms thickness formed thereon and a polysilicon line of about 1 micron width and about 3000 Angstroms height formed thereon and covered with a 200 Angstrom thick layer of silicon oxide, L was masked with a 1.5 micron wide photoresist mask, inserted into an anisotropic etching apparatus, and then RIE etched at a power level of 250 watts using $Cl_2$/HBr chemistry at respective concentrations of 30 sccm and 15 sccm.

The chlorine line emission from the resulting plasma was monitored during the etch by optical emission spectroscopy. When the emission of the chlorine line brightened, indicating that the RIE etch had reached the level of the gate oxide and the oxide on top of the polysilicon step, i.e., at least some of the chlorine gas used to etch the polysilicon was not being used, the etch was stopped.

An overetch, or second stage of the RIE etch, was then performed using the same RIE apparatus, but at a power level of 100 watts and with the chemistry of the etch changed to $HBr/Cl_2/He/O_2$ (70%He/30% $O_2$) with respective concentrations of 30 sccm HBr, 15 sccm $Cl_2$, and 2 sccm $He/O_2$ to provide etch conditions much more selective to the etching of polysilicon without etching silicon oxide to protect the gate oxide from inadvertent etching. The RIE overetch was carried out for about 2 minutes.

The RIE etched integrated circuit structure was then removed from the anisotropic etching apparatus and dipped for 30 seconds in a 1 wt. % potassium hydroxide solution maintained at a temperature of about 50° C. The integrated circuit structure was then removed from the hydroxide bath, rinsed in room temperature deionized water, and then allowed to dry. The resulting structure was examined under a scanning electron microscope and found to have a structure free from polysilicon spikes adjacent the raised polysilicon line and also free from polymerized silicon/oxide-containing materials adjacent the sidewalls of the portion of the polysilicon layer remaining beneath the partially stripped away photoresist mask.

Thus, the invention provides an improvement in the process for the anisotropic etching of a polysilicon layer, which is formed over a step on an integrated circuit structure, masked with a photoresist, and then anisotropically etched to remove the exposed portions of the polysilicon layer leaving residues of polysilicon adjacent to the step and residues of a polymerized silicon/oxide-containing material adjacent the sidewalls of the masked portions of polysilicon wherein such residues of polysilicon and polymerized silicon/oxide-containing materials are removed by treating the integrated circuit substrate with a dilute hydroxide solution to remove both the polysilicon residues and the residues of polymerized silicon/oxide-containing material.

Having thus described the invention, what is claimed is:

1. In a process wherein a polysilicon layer, which is formed over an oxide-covered step on an integrated circuit structure and masked with a photoresist, is anisotropically etched to remove the exposed portions of the polysilicon layer leaving residues of polysilicon adjacent to the step and residues of a polymerized silicon- /oxide-containing material on the sidewalls of the unetched remaining masked portions of polysilicon, the improvement comprising: treating the integrated circuit substrate with a dilute hydroxide solution having a concentration ranging from about 0.5 to 5.0 wt. % hydroxide for a time period not exceeding about 1 minute and while maintaining said hydroxide solution at a temperature ranging from about 40° to about 60° C. to remove both the polysilicon residues and the residues of polymerized silicon/oxide-containing material with minimum damage to exposed oxide portions on the structure and while maintaining the etched polysilicon profile.

2. The process of claim 1 wherein said dilute hydroxide solution comprises a hydroxide selected from the class consisting of potassium hydroxide and ammonium hydroxide.

3. The process of claim 1 wherein said treatment with said dilute hydroxide solution is carried out for a period of from about 5 to 60 seconds.

4. The process of claim 1 wherein said treatment in said dilute hydroxide solution is carried out while maintaining said hydroxide solution at a temperature ranging from about 45° to about 55° C.

5. The process of claim 1 wherein said treatment in said dilute hydroxide solution is carried out while maintaining said hydroxide solution at a temperature of about 50° C.±2° C.

6. The process of claim 2 wherein said hydroxide solution comprises a solution of potassium hydroxide.

7. The process of claim 2 wherein said hydroxide solution comprises a solution of ammonium hydroxide.

8. The process of claim 1 wherein said integrated circuit structure is RIE etched prior to said step of treating said integrated circuit structure in said dilute hydroxide solution.

9. The process of claim 1 wherein said treatment of said integrated circuit structure with said dilute hydroxide solution further comprises treating said integrated circuit structure for from about 5 to 60 seconds with a potassium hydroxide solution having a concentration ranging from about 0.5 to about 5.0 wt. % hydroxide and maintained at a temperature of from about 45° to about 55° C.

10. In a process wherein a polysilicon layer, which is formed over an oxide-covered step on an integrated circuit structure and masked with a photoresist, is anisotropically RIE etched to remove exposed portions of said polysilicon layer to form one or more polysilicon lines on said structure and wherein said RIE etching results in the formation of residues of a polymerized silicon/oxide-containing material on the sidewalls of said polysilicon lines formed by etching said polysilicon layer, and leaves residues of polysilicon adjacent to said oxide-covered step, the improvement comprising: treating said integrated circuit structure for a period of time not exceeding 1 minute with a dilute hydroxide solution selected from the class consisting of potassium hydroxide and ammonium hydroxide having a concentration of from 0.5 to 3.0 wt. % hydroxide and a temperature of from about 40° to 60° C. to remove both the polysilicon residues and the residues of polymerized silicon/oxide-containing material with minimum damage to exposed silicon oxide portions of said structure and said polysilicon lines.

11. The process of claim 10 wherein said treatment with said dilute hydroxide solution is carried out for a period of from about 5 to 60 seconds.

12. The process of claim 10 wherein said treatment in said dilute hydroxide solution is carried out while maintaining said hydroxide solution at a temperature ranging from about 45° to about 55° C.

13. The process of claim 10 wherein said treatment in said dilute hydroxide solution is carried out while maintaining said hydroxide solution at a temperature of about 50° C.±2° C.

14. The process of claim 13 wherein said hydroxide solution comprises a solution of potassium hydroxide.

15. The process of claim 13 wherein said hydroxide solution comprises a soloution of ammonium hydroxide.

16. An improved process for etching a polysilicon layer masked with a photoresist and which is formed over a step previously formed on an integrated circuit structure having exposed portion of silicon oxide thereon which comprises:
(a) anisotropically RIE etching said polysilicon layer to remove exposed portions of said polysilicon layer, leaving residues of polysilicon adjacent to said step and residues of a polymerized silicon/oxide-containing material adjacent the sidewalls of said masked portions of said polysilicon layer; and
(b) treating said integrated circuit structure for a period of time not exceeding about 1 minute with a dilute hydroxide solution selected from the class consisting of potassium hydroxide and ammonium hydroxide having a concentration of from 0.5 to 5.0 wt. % hydroxide and a temperature of from about 40° to about 60° C. to remove both said polysilicon residues and said residues of said polymerized silicon/oxide-containing material without damaging said exposed silicon oxide portions of said structure.

17. The process of claim 16 wherein said hydroxide solution comprises a solution of potassium hydroxide maintained at a temperature of about 50° C.±2° C.

18. An improved process for forming a polysilicon line on an integrated circuit structure which comprises:
(a) forming a polysilicon layer over an oxide layer and an oxide-covered step previously formed on said integrated circuit structure;
(b) masking said polysilicon layer with a photoresist mask patterned to form said polysilicon line upon subsequent etching of said polysilicon layer through said photoresist mask;
(c) anisotropically RIE etchign said polysilicon layer to form said polysilicon line by removing exposed portions of said polysilicon layer, said RIE etching step resulting in the formation of polysilicon residues adjacent said oxide-covered step and residues of a polymerized silicon/oxide-containing material on the sidewalls of said polysilicon line; and
(d) removing said polysilicon residues and said residues of polymerized silicon/oxide-containing material without damaging said exposed silicon oxide portions of said structure and while maintaining the etched polysilicon profile by treating said integrated circuit structure for a period of time not exceeding about 1 minute with a dilute hydroxide solution selected from the class consisting of potassium hydroxide and ammonium hydroxide having a concentration of from 0.5 to 5.0 wt. % hydroxide and maintained at a temperature of from about 40° to about 60° C.

* * * * *